United States Patent [19]
Abe et al.

[11] 3,974,332
[45] Aug. 10, 1976

[54] TABLET FOR USE IN A COORDINATE DIGITIZER

[75] Inventors: Kiyomi Abe, Noda; Yoshio Shishido, Soka; Genichi Tagata, Koshigaya; Tadaaki Sugino, Koshigaya; Yoshiharu Yamashiro, Koshigaya, all of Japan

[73] Assignee: Pentel Kabushiki Kaisha, Japan

[22] Filed: Mar. 10, 1975

[21] Appl. No.: 556,980

[52] U.S. Cl. .......................... 178/18; 235/61.11 H; 340/365 C
[51] Int. Cl.² .................. G08C 21/00; G06K 7/08; G08B 5/36
[58] Field of Search ........................ 178/18, 19, 20; 340/365 C, 173 CA, 146.3 SY, 146.3 MA; 235/61.11 H; 179/90 K; 200/46; 346/139 C

[56] References Cited
UNITED STATES PATENTS

| | | | |
|---|---|---|---|
| 3,585,368 | 6/1971 | Nunamaker | 235/61.11 H |
| 3,757,322 | 9/1973 | Barkan et al. | 340/365 C |

*Primary Examiner*—Thomas A. Robinson
*Attorney, Agent, or Firm*—Robert E. Burns; Emmanuel J. Lobato; Bruce L. Adams

[57] ABSTRACT

A capacitively coupled tablet for use with an electrically conductive pen comprises segments each including at least one lattice point of a matrix which comprises groups of spaced conductors which are disposed along coordinate axes. The segments are mutually electrically isolated by an electrically conductive shield layer having apertures which correspond to the surface area of the respective segments, and are marked with corresponding characters to serve as keys. An electrically insulating layer is disposed between the shield layer and the groups of conductors, and a similar surface layer is disposed on the shield layer.

4 Claims, 8 Drawing Figures

TABLET FOR USE IN A COORDINATE DIGITIZER

BACKGROUND OF THE INVENTION

The invention relates to a tablet for use in a coordinate digitizer, and more particularly, to a capacitively coupled tablet in which a matrix comprising two groups of spaced conductors disposed along the coordinate axes is divided into segments, each operable as an independent "key" region and marked with a corresponding character.

An electronic equipment is well known which converts the locus of a pen moving, as when handwriting a picture, into a series of digital coded signals in time sequence. U.S. Pat. No. 3,567,859 (Ellis) issued Mar. 2, 1971 and U.S. Pat. No. 3,732,369 (Cotter) issued May 8, 1973 teach the use of a tablet having a lattice formed by parallel wires running along the coordinate axes and which are spaced apart with a regular interval. In such a tablet, one group of conductors is sequentially pulsed, followed by the pulsing of the other group of conductors. The pen which is used to write a figure on the surface of the tablet has its tip end formed of a conductor for capacitive coupling with wires within the lattice. A signal which is produced on the pen from the pulsed conductor is used to digitalize the coordinates of the pen position on the tablet. The pen position along one coordinate is digitalized, followed by the digitalization of the pen position along the other coordinate. A conventional tablet is designed for inputting a handwritten figure into a computor, and to this end, its surface defines a completely flat plane so as to permit a free movement of the pen thereacross either directly or with a paper interposed.

Recently, there has been a proposal that the surface of the tablet be divided into segments which are marked with specific characters so as to permit the tablet to be used as a keyboard. With such a tablet, each segment represents one key region, which operates to form a digital signal representing a coordinate position. Here, there is no conversion of the locus of the pen into a series of digital signals, but the position of the pen moving from one segment to another in a random manner may be independently digitalized, so that the lattice may comprise two groups of broad or wide conductors in distinction to the earlier tablet having a finely divided lattice so as to improve the resolution of the locus. Since it is intended that each segment is marked with a particular character, there must be a certain surface area in order to provide such indication. However, it is necessary that the lattice points be arranged in a manner such that the pen can pick up a same signal wherever it is placed within a segment.

A keyboard formed by a tablet mentioned above has no limitation on the number of segments or keys, and therefore is preferred for use for inputting into a computor information selected from a great number of items such as Japanese or Chinese letters, for example, or for maintaining an inventory of parts or medicines which are present in as many as several thousand items. However, the proposed tablet which is to be used as a keyboard comprises a flat character sheet disposed on a tablet body which has a flat surface in the same manner as a figure inputting tablet. This results in disadvantages that when the pen is placed against the character sheet, the pen may be displaced from the intended key or may be situated intermediate two adjacent keys, thereby causing an erroneous input. On the other hand, the signal produced on the pen will become maximum when that conductor which is located closest to its tip is pulsed, but a capacitive coupling with conductors of the same group which are located on the opposite sides of the first mentioned conductor also produces signals of gradually decreasing amplitude. Thus, there is a need that this type of tablet be used with a sensor which is only responsive to an output in a pulse train which has the maximum amplitude. Where the keys are relatively closely spaced, the difference in amplitude between the pulse having the maximum amplitude and adjacent pulses will be reduced, rendering it difficult to operate the sensor in an optimal manner. It is essential to completely eliminate the likelihood that the sensor may operate in response to pulses from adjacent keys when the pen is accurately located on an intended key.

SUMMARY OF THE INVENTION

Therefore, it is an object of the present invention to provide a tablet for a coordinate digitizer in which each of individual segments on a matrix represents one coordinate position and is capable of locating a conductive pen in a positive and unambiguous manner.

It is another object of the invention to provide a capacitively coupled tablet in which a signal sensed from one segment has a sufficiently large amplitude to distinguish it from signals obtained from adjacent segments.

It is a further object of the invention to provide a tablet for use as a keyboard in which each segment defines a key region of a sufficient surface area to permit a character representative of the key to be marked thereon.

In accordance with the invention, the segments on a matrix are electrically isolated from each other by a conductive shield layer having apertures which are substantially equal to the surface area of the respective segments, and is also physically divided by a surface insulating layer having outwardly extending portions which represent a projection of the shield layer. Each segment includes at least one lattice point, and the capacitive coupling between the pen which is placed against one segment and a conductor extending through an adjacent segment is suppressed by the shield layer, thus achieving crosstalk-free sensing of the signal from the segment against which the pen is placed.

BRIEF DESCRIPTION OF THE DRAWINGS

The above and other objects, features and advantages of the invention will be better understood from the following detailed description of several embodiments thereof shown in the attached drawings, in which.

DESCRIPTION OF THE PREFERRED EMBODIMENTS

Figure 1:
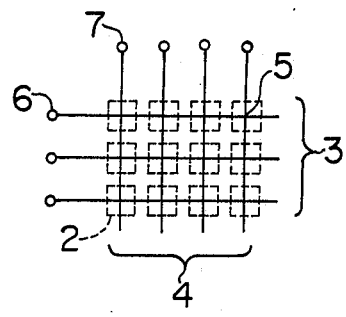
FIG. 1 is a schematic plan view of a matrix comprising two groups of conductors, showing segments formed.
Figure 2:
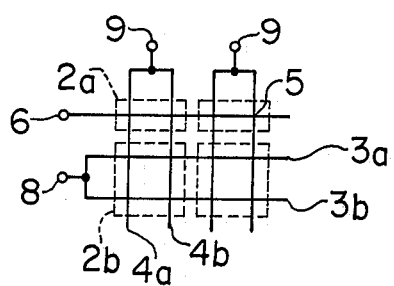
FIG. 2 is a schematic plan view illustrating a slightly modified arrangement of segments.

Referring to FIGS. 1 and 2, there are shown segments 2 defined on the surface of a matrix comprising two groups of conductors 3, 4. Each segment 2 represents a key region, and every point within such region substantially assumes a single coordinate position. In FIG. 1, the groups of conductors 3, 4 are arranged so that they form one lattice point 5 within each segment 2. The conductors 3, 4 are connected with terminals 6, 7, respectively. In the arrangement of FIG. 2, each segment 2a, 2b contains a plurality of lattice points 5, and conductors 3a, 3b and 4a, 4 b of the respective same groups which extend through the same segment 2a, 2b are connected with common terminals 8,9, respectively. The segments 2a, 2b illustrate two examples of the arrangement. Thus, the region of the respective segments 2a, 2b again represents substantially one coordinate position. For the convenience of the description, the groups of conductors 3, 4 are shown at a given spacing therebetween in FIGS. 1 and 2, but the spacing may be varied. However, it will be noted that with the arrangement of FIG. 2, it is possible to form the segment 2a, 2b which has a single coordinate position while retaining a broad surface area. It should be noted that in this instance, any desirable number of lattice points 5 can be uniformly distributed within the respective segments 2a, 2b.

The groups of conductors 3, 4 are sequentially pulsed from the respective terminals 6, 7, 8, 9 in a known manner, and when the conductors 3, 4 extending through each segment 2 are pulsed, a signal can be sensed by the pen from the segment 2. A pulse scanning system such as disclosed in U.S. Pat. No. 3,732,369 may be used. In the arrangement of FIG. 2, the pen may be placed anywhere within the segment 2a, 2b having a broad surface area to produce an identical pulse, and the pulse scanning system used in this instance may also be conventional.

Figure 3:
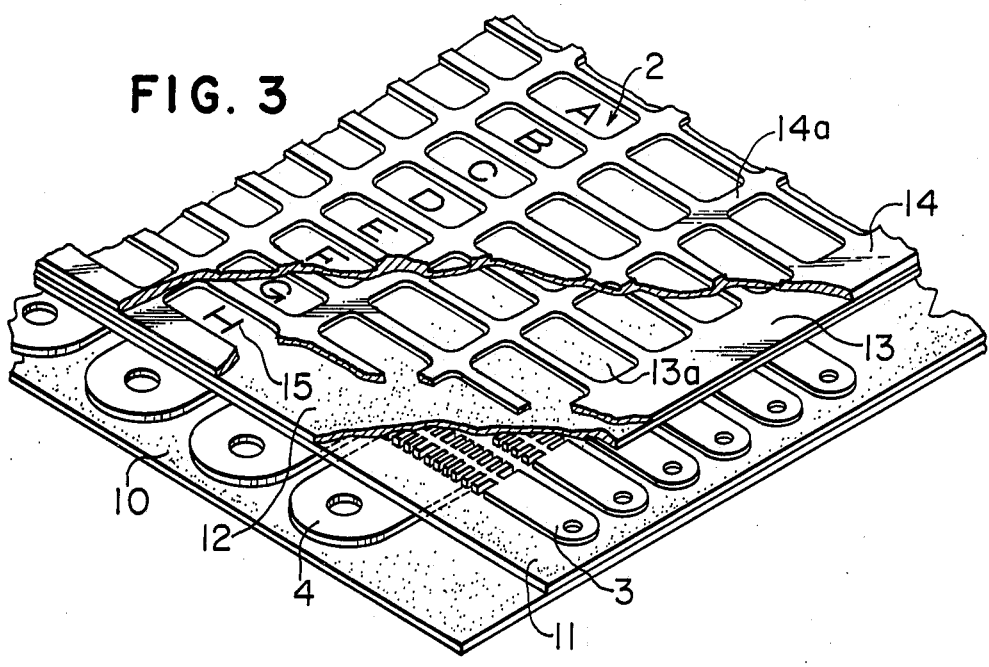
FIG. 3 is a fragmentary perspective view, partly cut away, of the tablet according to the invention.

FIG. 3 shows the tablet constructed according to the invention. The tablet is characterized by the provision of a shield layer 13 formed of an electrically conductive material and having apertures 13a which substantially correspond in area to the surface area of the respective segments 2. The shield layer 13 is disposed on the matrix comprising two groups of conductors 3, 4 so as to define a boundary between the segments 2. An intermediate insulating layer 11 is interposed between the tiers of the two groups of conductors 3, 4. Specifically, the group of conductors 3 are disposed between the intermediate insulating layer 11 and an upper insulating layer 12, while the other group of conductors 4 are disposed between the intermediate insulating layer 11 and a lower insulating layer 10. In the embodiment shown in FIG. 3, each segment 2 contains one lattice point 5, and the shield layer 13 which electrically isolates the segments 2 is disposed on the surface of the upper insulating layer 12. The shield layer 13 may comprise a copper foil printed on the upper insulating layer 12 and is connected with the ground.

Figure 4:
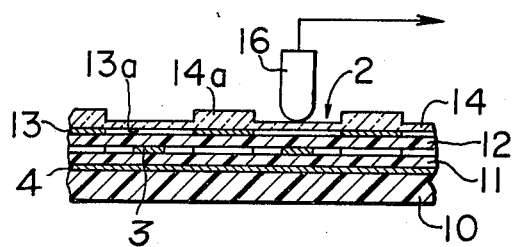
FIG. 4 is a cross section of the tablet shown in FIG. 3.

Referring to FIG. 4, it will be seen that a surface insulating sheet 14 having outwardly extending portions 14a is placed on the shield layer 13 in order to physically divide the respective segments 2. In a preferred embodiment, the outwardly extending portions 14a of the surface insulating sheet 14 represent a projection of the shield layer 13, but may have an increased width. By way of exaggeration, a gap is shown between the surface insulating sheet 14 and the shield layer 13 in each segment 2, but such gap can be actually eliminated since the shield layer 13 may comprise a thin film such as a printed copper film as mentioned above. To permit the use of the respective segments 2 as key regions, characters 15 corresponding to the keys may be marked on the outer surface of the upper insulating layer 12. In this instance, it is preferred that the surface insulating sheet 14 be formed of a transparent material.

Figure 7:
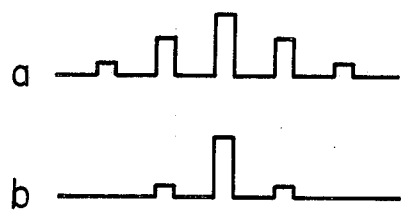
FIGS. 7a and 7b are diagrams illustrating pulses obtained from a conventional tablet and from the tablet of the invention, respectively.

Since in the tablet according to the invention, each segment 2 corresponding to a key is electrically isolated from each other segment 2 by the shield layer 13, a pen 16 may be applied against the key to produce a signal which is substantially free from crosstalk. With a conventional tablet, the signal obtained is in the form of a train of pulses as shown in FIG. 7a in which the difference in amplitude between adjacent pulses is very small, requiring a peak detector in order to detect the pulse having the maximum amplitude from the train. However, when the tablet according to the invention is employed, the pulse having the maximum amplitude is only associated with small crosstalk components, so that such pulse can be discriminated from the crosstalk components by a simple circuit arrangement such as a Schmitt circuit, without requiring a peak detector. Such effect is achieved in accordance with the invention by the grounded shield layer 13 which suppresses a capacitive coupling between the pen 16 applied against one segment 2 and conductors 3, 4 which extend through adjacent segments, as will be apparent from FIG. 4. Also in accordance with the invention, the respective segments 2 are physically divided from each other by the surface insulating sheet 14, so that an inadvertent displacement of the pen 16 from an intended segment 2 or placement of the pen 16 against a boundary region between adjacent segments can be substantially eliminated.

Figure 5:
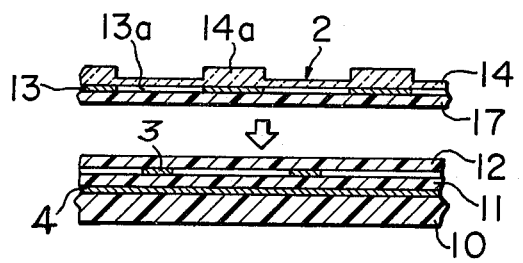
FIG. 5 is a cross section of another tablet which is similar to that of FIG. 4 except that a code plate is separate from the tablet body.

FIG. 5 shows a modification of FIG. 4 in which the shield layer 13 is interposed between the surface insulating sheet 14 and an insulating base 17 which constitutes a character indication plate, the sheet 14 and the base 17 being separate from the upper insulating layer 12 of the tablet body. In this embodiment, characters can be marked on the insulating base 17 so as to permit an interchangeable use of the character indication plate with respect to the tablet body. If desired, a character indication sheet may be separately provided and inserted between the upper insulating layer 12 of the tablet body and the insulating base 17.

Figure 6:
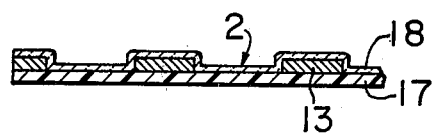
FIG. 6 is a cross section of a modification of the code plate of FIG. 5.

FIG. 6 shows a modification of the character indication plate shown in FIG. 5, particularly illustrating a surface insulating layer 18 which can be substituted for the surface insulating sheet 14 shown in FIG. 4. The surface insulating layer 18 is formed by applying a thermoplastic resin film of substantially uniform thickness against the shield panel 13 under heat and pressure, thus coating an exposed portion of the insulating base 17 which is located within the region of the segment 2. The use of such surface insulating layer 18 will be advantageous in reducing the cost where the shield panel 13 has such a thickness that it not only electrically isolates the segments 2, but also physically divides them.

Having described the invention, what is claimed is:

1. In a coordinate digitizer tablet of the type including a matrix of conductors comprised of a first group of spaced conductors disposed to define a first coordinate axis, and a second group of spaced conductors disposed to define a second coordinate axis, said first group and said second group of conductors being superposed and mutually oriented so that the conductors comprising said two groups cross to define lattice points of said matrix at the cross-over points of the respective conductors defining said matrix; and means mutually electrically insulating said conductors; said conductors sequentially receiving in operation electrical pulses which are sensed by capacitive coupling with the matrix to indicate the position on said matrix with respect to the coordinate axes to which the capacitive coupling is made; the improvement which comprises: an electrically conductive shield layer disposed overlying said matrix and defining an electrical shield, said shield having means defining therethrough apertures positioned to expose said lattice points and dimensioned to define unshielded segments of said matrix for capacitive coupling therewith and to substantially prevent capacitive coupling with other portions of said matrix thereby to substantially prevent sensing of electrical signals applied to the respective electrical conductors defining other lattice points of said matrix; means electrically insulating said shield from said matrix; and a surface insulative layer disposed on a major surface of said shield opposite said matrix.

2. A tablet according to claim 1 in which each of the unshielded segments contains a single lattice point.

3. A tablet according to claim 1 in which each of the unshielded segments contains a plurality of lattice points, and wherein the conductors of a respective group extending through a single unshielded segment are connected in common.

4. A tablet according to claim 1 in which the surface layer includes outwardly extending portions on the surface thereof which physically divide the unshielded segments.

* * * * *